(12) United States Patent
Greim

(10) Patent No.: US 9,063,199 B2
(45) Date of Patent: Jun. 23, 2015

(54) LOCAL COIL

(75) Inventor: Helmut Greim, Adelsdorf (DE)

(73) Assignee: Siemens Aktiengesellschaft, München (DE)

( * ) Notice: Subject to any disclaimer, the term of this patent is extended or adjusted under 35 U.S.C. 154(b) by 217 days.

(21) Appl. No.: 13/224,824

(22) Filed: Sep. 2, 2011

(65) Prior Publication Data

US 2012/0223714 A1 Sep. 6, 2012

(30) Foreign Application Priority Data

Sep. 3, 2010 (DE) .................. DE 10 2010 040 260

(51) Int. Cl.
*G01V 3/00* (2006.01)
*G01R 33/36* (2006.01)

(52) U.S. Cl.
CPC .......... *G01R 33/3621* (2013.01); *G01R 33/365* (2013.01); *G01R 33/3642* (2013.01)

(58) Field of Classification Search
CPC .................................................... G01R 33/365
USPC ................... 324/322, 318, 311, 314
See application file for complete search history.

(56) References Cited

U.S. PATENT DOCUMENTS

| | | | |
|---|---|---|---|
| 4,788,503 A * | 11/1988 | Van Heelsbergen | 324/322 |
| 4,955,046 A | 9/1990 | Siczek et al. | |
| 7,126,337 B2 * | 10/2006 | Oppelt | 324/322 |
| 7,362,101 B2 * | 4/2008 | Muftuler et al. | 324/318 |
| 8,421,461 B2 * | 4/2013 | Cork et al. | 324/316 |
| 2007/0280426 A1 | 12/2007 | Saffer | |
| 2009/0296892 A1 | 12/2009 | Fadler et al. | |

FOREIGN PATENT DOCUMENTS

| | | |
|---|---|---|
| DE | 10 2004 011 460 A1 | 10/2005 |
| DE | 10 2004 038 849 A1 | 2/2006 |
| DE | 103 14 215 B4 | 11/2006 |
| DE | 10 2008 026 622 A1 | 12/2009 |

OTHER PUBLICATIONS

German Office Action dated Jun. 9, 2011 for corresponding German Patent Application No. DE 10 2010 040 260.5 with English translation.
German Office Action dated Feb. 9, 2012 for corresponding German Patent Application No. DE 10 2011 077 086.0 with English translation.

* cited by examiner

*Primary Examiner* — Louis Arana
(74) *Attorney, Agent, or Firm* — Lempia Summerfield Katz LLC

(57) ABSTRACT

The present embodiments relate to a local coil for a magnetic resonance tomography system. The local coil includes a preamplifier for amplification of a signal received by the local coil from an examination object in a receive phase of the local coil. The local coil also includes a detuning device for detuning the local coil in a transmit phase of the local coil, and a rectification device for supplying voltage to the preamplifier.

23 Claims, 4 Drawing Sheets

LOCAL COIL

This application claims the benefit of DE 10 2010 040 260.5, filed on Sep. 3, 2010.

BACKGROUND

The present embodiments relate to a coil arrangement for a magnetic resonance tomography system.

Magnetic resonance devices for examining objects or patients using magnetic resonance tomography (MRT) are known, for example, from DE10314215B4.

In MR tomography, signals are received using local coils or loops. In the process, excited nuclei of an examination object (e.g., of a patient) induce a voltage by way of radiation emitted by the excited nuclei in an antenna of a local coil receiving the radiation. The induced voltage is amplified using a low-noise preamplifier (LNA) and forwarded by cable to an electronic receive system of an MRT system.

Components of the local coil include, for example, a preamplifier and a device for actively detuning an antenna of the local coil during a transmit phase of the local coil. Active detuning of the local coil takes place, for example, using a PIN diode and a lambda/4 line (e.g., a λ/4 line) in a resonant circuit of the local coil. A supply voltage for the preamplifier may be generated, for example, locally by a battery on the part of the local coil or may be supplied to the local coil by way of one or two separate lines.

SUMMARY

The present embodiments may obviate one or more of the drawbacks or limitations in the related art. For example, a magnetic resonance tomography local coil may be optimized.

SUMMARY AND DESCRIPTION

DETAILED DESCRIPTION OF DRAWINGS

Figure 4:
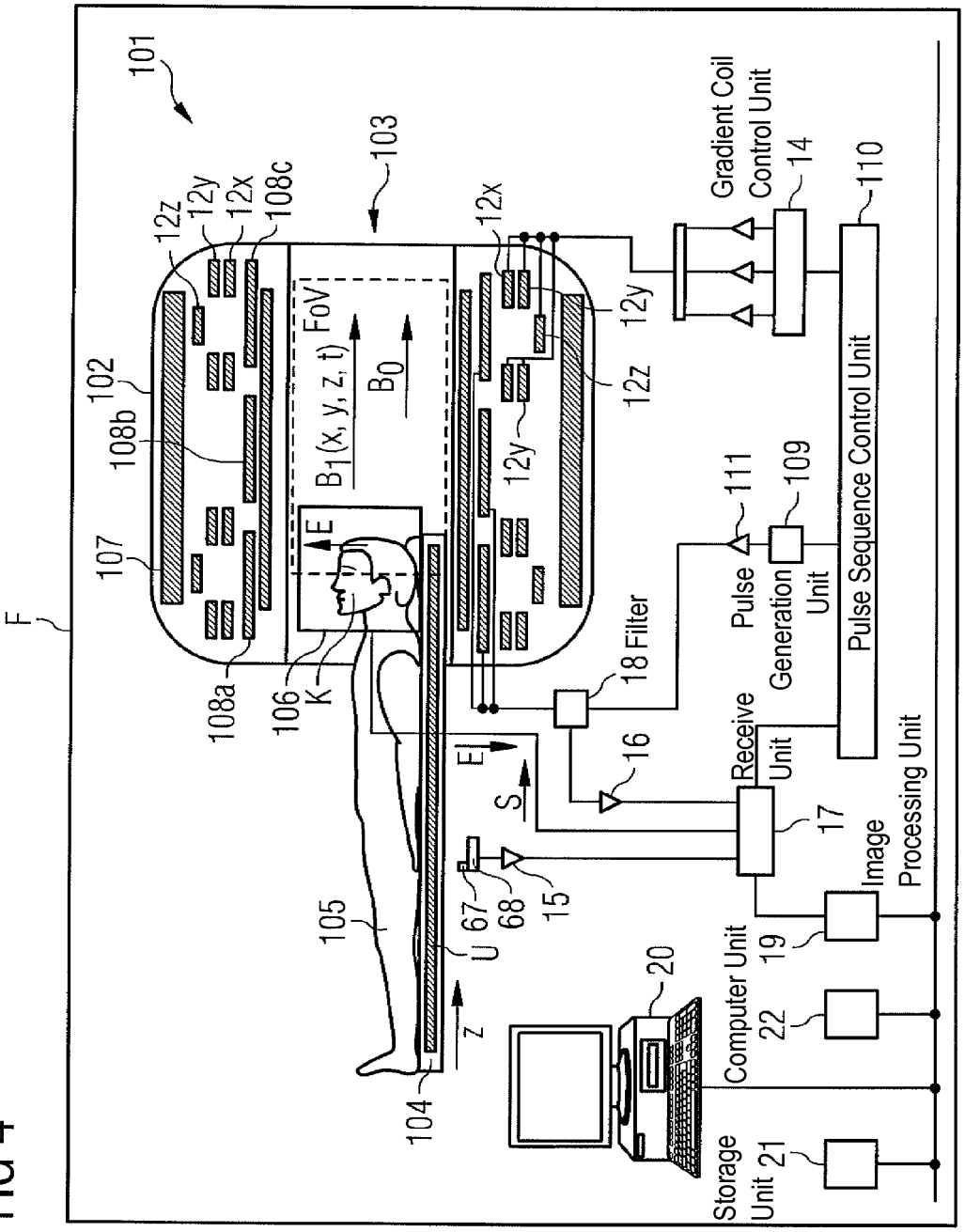
FIG. 4 shows a schematic diagram of magnetic resonance tomography system.

FIG. 4 shows (in a space insulated with a Faraday cage F) an imaging magnetic resonance device MRT 101 having a whole-body coil 102 with a tubular or laterally open examination-object-receiving opening 103 (e.g., also enclosing an examination region FoV of the MRT 101 at a top and a bottom with a housing wall MRT 101), into which (103) a patient couch 104 holding an examination object 105 (e.g., a patient) may be moved in the direction of the arrow z to generate recordings of the patient 105. Positioned on the patient 105, for example, is a local coil arrangement 106 (e.g., a local coil system) that may be used (e.g., when at least a part of the patient 105 is inserted in direction z into the field of view FoV) to take recordings of a local region (e.g., of the head K) of the patient. Received signals may be transmitted from the local coil arrangement 106 (e.g., by way of a coaxial cable or by radio (antenna 67)) to a component 67, 66, 15, 17 of the MRT 101 and processed at the component 67, 66, 15, 17 (e.g., converted to images using an evaluation device and/or stored and/or displayed).

In order to use a magnetic resonance device MRT 101 to examine a body 105 (e.g., the examination object or the patient) using magnetic resonance imaging, different magnetic fields, temporal and spatial characteristics of which are matched to one another, are radiated onto the body 105. A powerful magnet (e.g., a cryomagnet 107) in a measuring cabin with, for example, a tunnel-type opening 3, generates a powerful static main magnetic field $B_0$ of, for example, 0.2 Tesla to 3 Tesla or even more. The body 105 to be examined is supported on the patient couch 104 and moved into a region of the main magnetic field B0 that is roughly homogeneous in the field of view FoV. The nuclear spin of atomic nuclei of the body 105 is excited by way of magnetic high-frequency excitation pulses that are radiated in by way of a high-frequency antenna shown in a simplified manner as a body coil 108, for example (and/or optionally by way of a local coil arrangement). High-frequency excitation pulses are generated, for example, by a pulse generation unit 109 that is controlled by a pulse sequence control unit 110. After amplification by a high-frequency amplifier 111, the generated high-frequency excitation pulses are routed to the high-frequency antenna 108 a, b, c. The high-frequency system illustrated in FIG. 4 is only shown schematically. In other embodiments, more than one pulse generation unit 109, more than one high-frequency amplifier 111 and a plurality of high-frequency antennas 108*a*, 108*b*, 108*c* (e.g., a body coil) are employed in a magnetic resonance device 101.

The imaging magnetic resonance device MRT 101 also includes gradient coils 12*x*, 12*y*, 12*z* that are used during a measurement to radiate in magnetic gradient fields for selective layer excitation and for local coding of the measurement signal. The gradient coils 12*x*, 12*y*, 12*z* are controlled by a gradient coil control unit 14 that, like the pulse generation unit 9, is connected to the pulse sequence control unit 110.

The signals emitted by the excited nuclear spins are received by the body coil 108*a*, 108*b*, 108*c* and/or at least one local coil arrangement 106, amplified by assigned high-frequency preamplifiers 16 and further processed and digitized by a receive unit 17. Recorded measurement data is digitized and stored as complex numerical values in a k-space matrix. The k-space matrix populated with values may be used to reconstruct an associated MR image using a multidimensional Fourier transformation.

For a coil that may be operated in both transmit and receive mode (e.g., the body coil 108*a, b, c*, or a local coil), correct signal forwarding is regulated by an upstream branching filter 18.

An imaging processing unit 19 uses the measurement data to generate an image. The image is displayed to a user by way of an operating console 20 and/or stored in a storage unit 21. A central computer unit 22 controls the individual system components.

In MR tomography, images with a high signal to noise ratio (SNR) may be recorded using local coil arrangements (e.g., coils, local coils). The local coil arrangements are antenna systems that are positioned in direct proximity on (anterior), beneath (posterior), or in the body. During an MR measurement, the excited nuclei induce a voltage in the individual antennas of the local coil. The induced voltage is amplified using a low-noise preamplifier (e.g., LNA, preamp) and is forwarded to the electronic receive system. To improve the signal to noise ratio even with high-resolution images, high-field systems are used (e.g., 1.5 T or 3 T or more). Since more individual antennas may be connected to an MR receive system than there are receivers present, a switching matrix (e.g., RCCS) is incorporated between the receive antennas and the receivers. This routes the currently active receive channels (e.g., receive channels located in the field of view (FoV) of the magnet) to the receivers present. This allows more coil elements to be connected than there are receivers present, since for whole-body coverage, only coils located in the FoV or in the homogeneity volume of the magnet may be read out.

The local coil system 106 may include, for example, one or several antenna elements (e.g., coil elements; in the manner of an array coil). The local coil system 106 includes, for example, coil elements, a preamplifier, further electronics, a housing, supports and a radio connection or a cable with plug, by which the local coil system 106 is connected to the MRT system. A receiver 68 positioned on the system side filters and digitizes signals received by the local coil 106 (e.g., by radio or cable) and transmits the data to a digital signal processor. The digital signal processor may derive an image or spectrum from the data obtained by measurement and supplies the image to a user (e.g., for subsequent diagnosis by the user and/or for storage).

Figure 1:
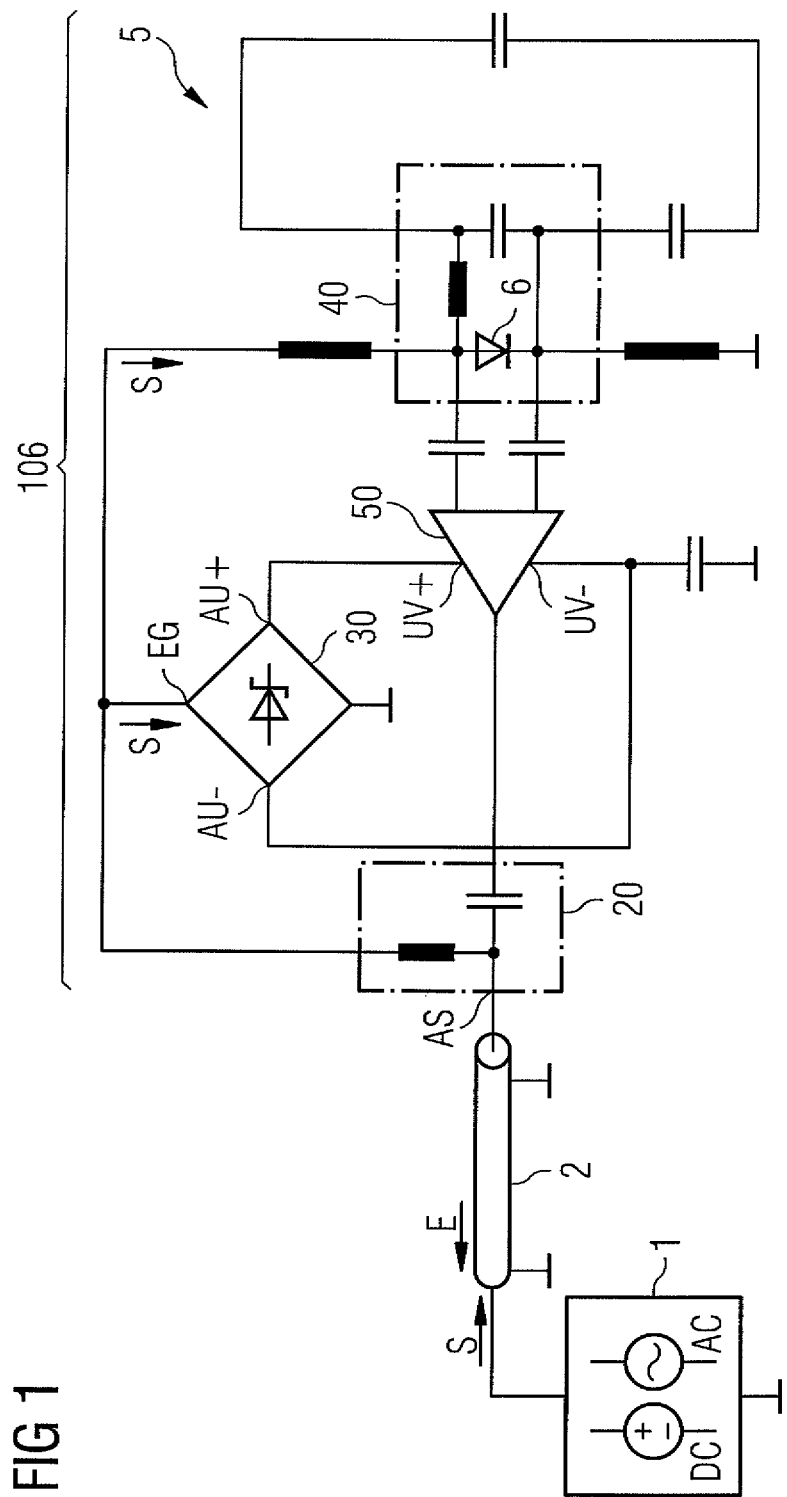
FIG. 1 shows a schematic diagram of one embodiment of a local coil.
Figure 2:
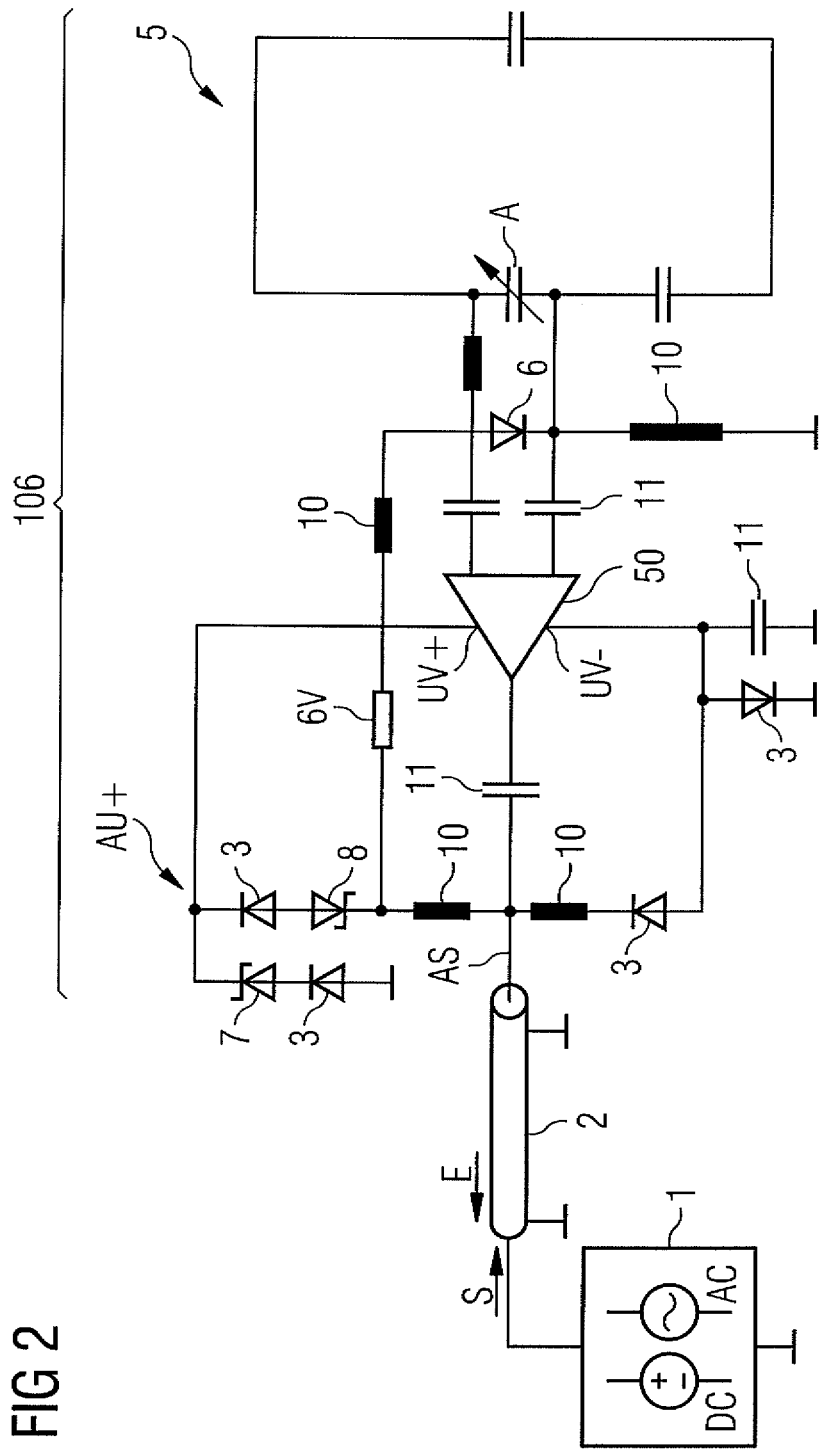
FIG. 2 shows a schematic diagram of another embodiment of a local coil.
Figure 3:
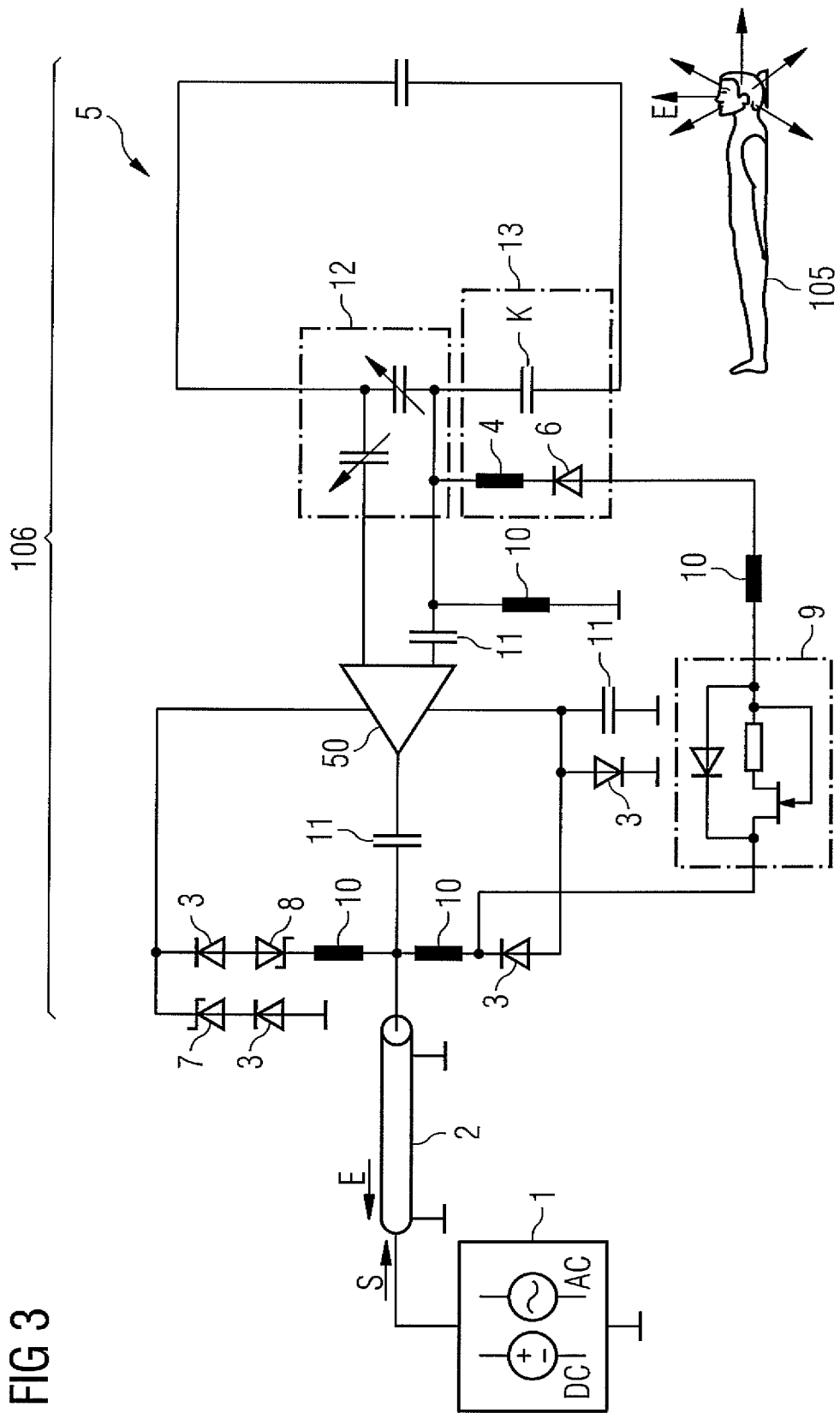
FIG. 3 shows a schematic diagram of one embodiment of a local coil.

Exemplary embodiments illustrated in FIGS. 1-3 are described in more detail in the following.

A magnetic resonance tomography local coil 106 of a magnetic resonance tomography (MRT) system 101 is connected by way of a line 2 (e.g., a coaxial cable) to a receive device and/or an evaluation device (e.g., elements 1, 67, 66, 15, 17) of the magnetic resonance tomography system 101.

An antenna 5 (or in the case of a local coil array, a plurality of antennas) of the local coil 106 receives signals E (e.g., high-frequency signals) emitted by an examination object 105 (e.g., a patient; shown considerably reduced in FIG. 3) in a receive phase (e.g., a phase, in which the coil is to receive. The signals E are amplified using at least one preamplifier 50 in or on the local coil 106 and are transmitted by way of the line 2 to a device (e.g., elements 1, 67, 66, 15, 17) of the magnetic resonance tomography system 101.

While the local coil 106 transmits (e.g., high-frequency excitation signals and/or gradient signals) in a transmit phase, signals S sent by way of the line 2 from a signal source 1 (or 17 in FIG. 4) are transmitted to a detuning device (e.g., elements 6, 13, 40) on the local coil 106 with the result that the detuning device 6, 13, 40 detunes the local coil 106 (e.g., while the local coil transmits) for receiving signals E from the examination object 105. Thus, the receiving of signals E from the examination object 105 is largely suppressed.

While the local coil 106 is to receive the signals E from the examination object 105 (e.g., atomic nuclei in the examination object) in a receive phase, the signals S (e.g., positive signals) are, however, not transmitted to a detuning device on the local coil 106 or signals S with a negative (e.g., reverse) voltage (e.g., prevoltage) are transmitted so that, for example, PIN diodes 6 switch from a let-through state to a blocking state. The local coil 106 is not detuned in the receive phase and receives the signals E from the examination object 105. The local coil 106 transmits the received signals E to the MRT 101 for evaluation.

The active detuning of the local coil 106 takes place, for example, using one or several PIN diode(s) 6 and a lambda/4 line in a resonant circuit of the antenna(s) 5 of the local coil (106) (e.g., and optionally, one or more capacitors K). A PIN diode 6 is actuated with a negative prevoltage of, for example, approximately 10-15V in the receive instance and with a positive voltage of, for example, approximately 10V in the transmit instance. The preamplifier(s) 50 is/are supplied with a direct current voltage of approximately 6-10 V. Supply voltages (e.g., of the preamplifier 50 and detuning PIN diodes 6) are generated, for example, locally by a battery on part of the local coil 106 or may be supplied to the local coil 106 with the signal S by way of two separate lines or, as shown, together with the signal S by way of one line 2.

The control signal of the PIN diode may be used, for example, to supply direct voltage to the preamplifier 50.

This may also take place, for example, in the transmit phase of the local coil (e.g., in a phase, in which the detuning device 6, 13, 40 of the local coil 106 detunes the local coil 106). In other words, when the preamplifier 50 does not amplify the receive signals E from the examination object, the preamplifier 50 is always supplied with a constant voltage during the receive and transmit phases (e.g., and idles). The preamplifier 50 does not have to settle thermally or electrically first in the receive phase as in DE102004038849A1, and the preamplifier 50 may operate in an optimized manner at least a little more quickly. The signal S (e.g., the control signal S) supplied to the detuning device 6 and rectified using the rectification device 3, 30 directly from an output AU+ of the rectification device 3, 30 (by way of a line) or by way of intermediate circuit elements at at least one voltage supply input UV+ of the preamplifier 50 (e.g., optionally also with voltage splitting or otherwise modified), is present at the preamplifier 50 or a voltage supply input of the preamplifier 50.

In FIG. 1, the control signal S for the PIN diodes 6 is transformed by rectification using a bridge circuit 30 to a positive direct current voltage for a continuous voltage supply to the preamplifier 50.

The preamplifier 50 may be operated in the steady state and may exhibit any thermal or electrical settling behavior.

HF choke coils 10 and a capacitor 11 (e.g., as a separator), for example, separate the low-frequency control signal S for the detuning device PIN diodes 6 from the high-frequency useful signal E, which the local coil 106 receives from the examination object 105 by way of the antenna(s) 5 (e.g., one antenna; in the case of an array, several antennas) and transmits amplified (using 50) by way of the line 2 to the MRT system and/or from a transmit signal.

The control signal S reaches the PIN diode(s) 6, for example, by way of a preresistance 6V (in FIG. 2) or by way of a current source 9 (in FIG. 3). In one embodiment, the current for the PIN diode(s) 6 is set by way of a voltage drop at a resistance 6V (See FIG. 2); in a further embodiment, the current for the PIN diode(s) 6 is defined precisely by a current source 9 (See FIG. 3).

A PIN diode 6 may be present, as shown in FIG. 1, directly at an input of the preamplifier 50 and/or, for example, somewhere in the resonant circuit of the antenna 5, as in the embodiment shown in FIG. 3.

In FIG. 1, a detuning device and a tuning device (e.g., for tuning the antenna 5 of the local coil 106 in the receive instance) are provided connected or combined in a tuning and detuning circuit 40.

In FIG. 3, a detuning device 13 (e.g., with a detuning coil 4 and a PIN diode 6) and an adjustment device 12 (e.g., a tuning device) are embodied separately from one another.

Parallel to the application of the signal S to the detuning device, the control signal S is also fed by way of a diode network (e.g., the bridge circuit 30) to the preamplifier 50 to supply the preamplifier 50 with voltage at one voltage supply input. Diodes 3 switch a polarity of the alternating control signal S (e.g., as a result of the alternating transmit phase and receive phase) to a continuously positive supply voltage for the preamplifier 50. The preamplifier 50 is thus supplied with a constant voltage during the receive and transmit phases, so that the preamplifier 50 operates (e.g., idles) even when the preamplifier 50 is not used for amplification in the transmit phase and therefore does not have to settle.

One input EG of the rectification device 3, 30 may be connected, for example, to a port AS (e.g., a socket or a plug) for the line 2, by way of which the local coil 106 may be connected to a magnetic resonance tomography system 17, 101.

The voltage supplied by applying the signal S may be adjusted using Zener diodes 7, 8 to the supply voltage of the preamplifier 50.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography system that is operable to transmit excitations signals, gradient signals, or the excitation signals and the gradient signals in a transmit phase and is operable to receive signals from an examination object in a receive phase, the local coil comprising:
   a preamplifier configured for amplification of the signal received by the local coil from the examination object in the receive phase;
   a detuning device configured for detuning the local coil in the transmit phase of the local coil; and
   a rectification device configured for supplying voltage to the preamplifier.

2. The local coil as claimed in claim 1, wherein the rectification device comprises a bridge circuit.

3. The local coil as claimed in claim 1, further comprising Zener diodes configured to modify a voltage of a signal supplied to the detuning device.

4. The local coil as claimed in claim 1, further comprising a direct current voltage switch, a detuning device actuation signal being present as direct current voltage at the rectification device and at the detuning device by way of the direct current voltage switch, a receive signal of an antenna amplified by the preamplifier being present on a line to a magnetic resonance tomography system by way of the direct current voltage switch.

5. The local coil as claimed in claim 1, wherein a signal that is present at the detuning device is also present at the rectification device both in a receive phase and in the transmit phase.

6. The local coil as claimed in claim 1, wherein the preamplifier is operated in a steady state mode.

7. The local coil as claimed in claim 1, wherein the rectification device is connected on an output side to a current supply, a voltage supply input of the preamplifier, or the current supply and the voltage supply input of the preamplifier, to supply current, voltage, or current and voltage to the preamplifier.

8. The local coil as claimed in claim 1, wherein a signal that is present at an input of the detuning device is also present at an input of the rectification device.

9. The local coil as claimed in claim 1, further comprising a separator configured to separate a low-frequency control signal supplied to the detuning device from the signal received by the local coil from the examination object.

10. The local coil as claimed in claim 1, wherein the detuning device comprises one or a plurality of PIN diodes.

11. The local coil as claimed in claim 1, wherein a line to a signal source for a signal supplied to the detuning device is connectable to a port of the local coil.

12. The local coil as claimed in claim 1, wherein a signal supplied to the detuning device is a control signal that actuates the detuning device to detune the local coil for receiving during the transmit phase of the local coil.

13. The local coil as claimed in claim 12, wherein the control signal is present at the detuning device by way of a preresistance.

14. The local coil as claimed in claim 12, wherein the control signal is present at the detuning device by way of a current source.

15. The local coil as claimed in claim 1, wherein a PIN diode is located at an input of the preamplifier.

16. The local coil as claimed in claim 1, further comprising at least one antenna, the at least one antenna comprising a resonant circuit,
   wherein at least one PIN diode is located in the resonant circuit.

17. The local coil as claimed in claim 1, wherein at least one output of the rectification device is connected to a voltage supply input of the preamplifier.

18. The local coil as claimed in claim 1, wherein a first output of the rectification device is connected to a first voltage supply input of the preamplifier, and
   wherein a second output of the rectification device is connected to a second voltage supply input of the preamplifier.

19. The local coil as claimed in claim 1, wherein at least one input of the rectification device is connected directly or by way of an intermediate element to a port for a line, the local coil being connectable to a magnetic resonance tomography system by way of the line.

20. The local coil as claimed in claim 1, wherein a signal that is present at the detuning device is also present at an input of the rectification device to supply voltage to the preamplifier.

21. The local coil as claimed in claim 3, wherein the Zener diodes are configured to modify the voltage of the signal supplied to the detuning device to a supply voltage required by the preamplifier.

22. The local coil as claimed in claim 9, wherein the separator comprises a coil and a capacitor.

23. A local coil for a magnetic resonance tomography system, the local coil being operable in both a transmit phase and a receive phase, the local coil comprising:
   a preamplifier configured for amplification of a signal received by the local coil from an examination object in the receive phase of the local coil;
   a detuning device configured for detuning the local coil for receiving signals from the examination object in the transmit phase of the local coil, the local coil being configured to transmit high-frequency excitation signals, gradient signals, or the high-frequency excitation signals and the gradient signals during the transmit phase; and
   a rectification device configured for supplying voltage to the preamplifier.

* * * * *